(12) United States Patent
Shini

(10) Patent No.: US 11,127,711 B2
(45) Date of Patent: Sep. 21, 2021

(54) SEMICONDUCTOR DEVICE

(71) Applicant: KIOXIA CORPORATION, Tokyo (JP)

(72) Inventor: Masato Shini, Mie Mie (JP)

(73) Assignee: KIOXIA CORPORATION, Tokyo (JP)

(*) Notice: Subject to any disclaimer, the term of this patent is extended or adjusted under 35 U.S.C. 154(b) by 25 days.

(21) Appl. No.: 16/807,910

(22) Filed: Mar. 3, 2020

(65) Prior Publication Data

US 2021/0074675 A1 Mar. 11, 2021

(30) Foreign Application Priority Data

Sep. 10, 2019 (JP) .............................. JP2019-164496

(51) Int. Cl.
*H01L 25/04* (2014.01)
*H01L 23/00* (2006.01)
(52) U.S. Cl.
CPC .............. *H01L 24/94* (2013.01); *H01L 24/20* (2013.01); *H01L 2924/01022* (2013.01); *H01L 2924/01029* (2013.01)
(58) Field of Classification Search
CPC ...................... H01L 24/94; H01L 24/20; H01L 2924/01022; H01L 2924/01029; H01L 21/3212; H01L 24/08; H01L 25/18; H01L 23/53228; H01L 23/528; H01L 23/5226; H01L 23/53214; H01L 27/14636; H01L 27/146; H01L 24/80; H01L 27/14634
USPC ......................................................... 257/621
See application file for complete search history.

(56) References Cited

U.S. PATENT DOCUMENTS

| 2012/0273774 | A1* | 11/2012 | Noda | H01L 21/8258 257/43 |
| 2015/0262877 | A1* | 9/2015 | Kurita | H01L 25/18 257/737 |
| 2015/0262989 | A1* | 9/2015 | Kawasaki | H01L 24/19 257/737 |
| 2017/0345806 | A1* | 11/2017 | Takemoto | H01L 21/3212 |
| 2018/0261575 | A1 | 9/2018 | Tagami et al. | |
| 2020/0035643 | A1* | 1/2020 | Hirata | H01L 27/14636 |

FOREIGN PATENT DOCUMENTS

| JP | 2003-249620 A | 9/2003 |
| JP | 2011-049270 A | 3/2011 |
| JP | 2016-181531 A | 10/2016 |

* cited by examiner

*Primary Examiner* — Didarul A Mazumder
(74) *Attorney, Agent, or Firm* — Foley & Lardner LLP

(57) ABSTRACT

According to one embodiment, a semiconductor device includes a first wafer, a first wiring layer, a first insulating layer, a first electrode, a second wafer, a second wiring layer, a second insulating layer, a second electrode, and a first layer. The first electrode includes a first surface, a second surface, a third surface, and a fourth surface. The second electrode includes a fifth surface, a sixth surface, a seventh surface, a second side surface, and an eighth surface. The first layer is provided between the fourth surface and a portion of the first insulating layer that surrounds the fourth surface, and is provided away from the third surface in the first direction.

21 Claims, 16 Drawing Sheets

SEMICONDUCTOR DEVICE

CROSS-REFERENCE TO RELATED APPLICATION(S)

This application is based upon and claims the benefit of priority from Japanese Patent Application No. 2019-164496, filed Sep. 10, 2019, the entire contents of which are incorporated herein by reference.

FIELD

Embodiments described herein relate generally to a semiconductor device.

BACKGROUND

As a semiconductor device, a configuration is proposed in which integrated circuits having various functions are separately manufactured at a wafer level, and then wafers are bonded to one another to form a single chip.

Examples of related art include JP-A-2011-49270.

DETAILED DESCRIPTION

Figure 1:
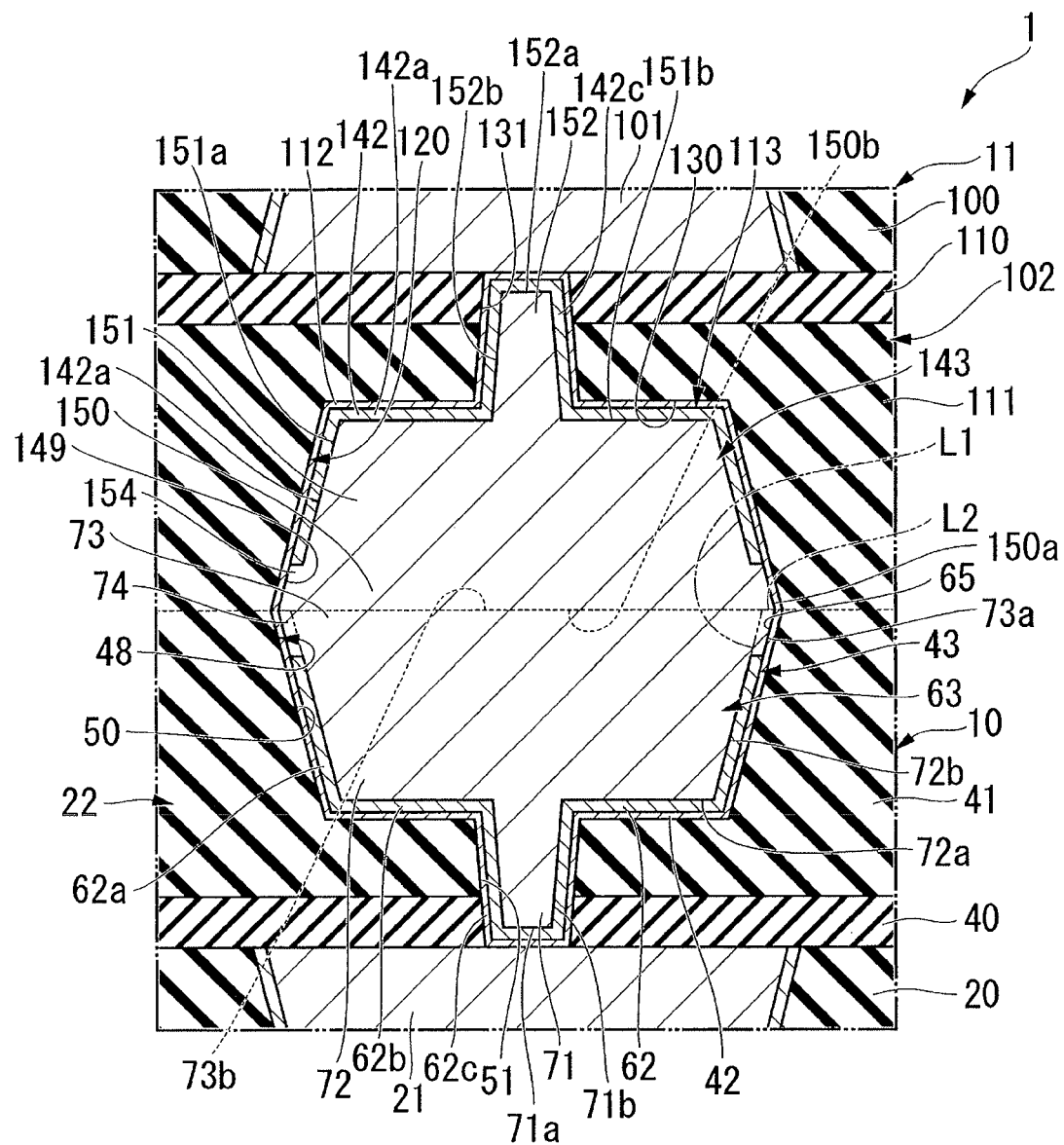
FIG. 1 is an enlarged cross-sectional view showing a semiconductor device according to an embodiment.
Figure 1:
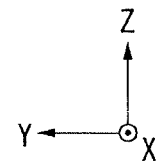

Embodiments provide a semiconductor device that can enhance bonding strength and conductivity between wafers.

In general, according to one embodiment, a semiconductor device includes a first wafer, a first wiring layer, a first insulating layer, a first electrode, a second wafer, a second wiring layer, a second insulating layer, a second electrode, and a first layer. The first wiring layer is provided in the first wafer. The first insulating layer is provided at a side of the first wiring layer along a first direction. The first electrode, provided in the first insulating layer, that includes a first surface connected to the first wiring layer, a second surface spaced from the first surface along the first direction, a third surface spaced farther away from the first surface than the second surface along the first direction, a first side surface directed from the first surface to the second surface, and a fourth surface directed from the second surface to the third surface. The second wiring layer is provided in the second wafer. The second insulating layer is provided at a side of the second wiring layer along the first direction that faces the side of the first wiring layer. The second electrode, provided in the second insulating layer, that includes a fifth surface connected to the second wiring layer, a sixth surface spaced from the fifth surface along the first direction, a seventh surface spaced further from the fifth surface than the sixth surface along the first direction, the seventh surface being connected to the third surface, a second side surface extended from the fifth surface to the sixth surface, and an eighth surface extended from the sixth surface to the seventh surface. The first layer is provided between the fourth surface and a portion of the first insulating layer that surrounds the fourth surface.

Hereinafter, semiconductor devices of embodiments will be described with reference to the accompanying drawings. In the following description, components having the same or similar functions are denoted by the same reference numerals. Repeated description of these components may be omitted. The drawings are schematic or conceptual. A relationship between a thickness and a width of each portion, a ratio of a size between the portions, and the like are not necessarily the same as the actual ones.

In the present disclosure, the term "connection" is not limited to a case of physical connection, but also means a case of electrical connection. That is, the term "connection" is not limited to a case where two members are in direction contact with each other, but also means a case where another member is interposed between the two members. On the other hand, the term "contact" means direct contact. In the present disclosure, terms "overlap" and "face" are not limited to two members directly facing each other, but also mean a case where another member is present between the two members. Further, the terms "overlap" and "face" also mean a case where a part of the two members overlap or face each other. Further, the term "thickness" is for convenience and may be replaced with "dimension". Further, the term "facing each other" means that at least a part of the two members overlap each other. That is, the term "face each other" is not limited to the two members entirely overlapping each other, but also means a case where a part of the two members overlap each other.

First, an X direction, a Y direction, and a Z direction are defined. The X direction is one direction among directions substantially parallel to surfaces of a first module 10 and a second module 11 to be described below (see FIG. 1). The Y direction (second direction) is a direction that intersects (for example, substantially orthogonal to) the X direction among the directions substantially parallel to the surfaces of the first module 10 and the second module 11. The Z direction is a direction substantially orthogonal to the surfaces of the first module 10 and the second module 11, and is a direction that intersects (for example, substantially orthogonal to) the X direction and the Y direction. The +Z direction (first direction) is a direction directed from the second module 11 to the first module 10 (see FIG. 1). The −Z direction is a direction opposite to the +Z direction. When not being distinguished from each other, the +Z direction and the −Z direction are simply referred to as the "Z direction". In the present disclosure, the "+Z direction" may be referred to as "up" and the "−Z direction" may be referred to as "down". However, these expressions are for convenience and do not define a direction of gravity.

FIG. 1 is an enlarged cross-sectional view showing a semiconductor device 1 of an embodiment.

As shown in FIG. 1, the semiconductor device 1 is, for example, a storage device. The semiconductor device 1 is formed by stacking the first module 10 and the second module 11 in the Z direction.

The first module 10 is, for example, a complementary MOS (CMOS) module. The first module 10 constitutes one or more CMOS circuits. Specifically, the first module 10 includes a first insulating film 20, first wiring layers (first signal layer) 21, and a first connection layer 22.

The first insulating film 20 is formed of, for example, silicon oxide (SiO) and the like. The first insulating film 20 may constitute a part of a first wafer in the first module 10. In the present embodiment, the first wafer may be a member where the first wiring layers 21 are provided, and may not be limited to a substrate of the first module 10, or may be a stacked body including a member where the CMOS circuits are stacked in addition to the substrate. Further, the first wafer may or may not include the substrate.

A plurality of first wiring layers 21 are provided at intervals, for example, in the X direction or the Y direction. The first wiring layers 21 are partitioned by the first insulating film 20.

The first connection layer 22 includes a first under layer 40, a first interlayer insulating layer (first insulating layer, insulating layer) 41, a first insulating layer (third layer) 42, and a first pad portion 43.

The first under layer 40 is provided at a lower portion of the first module 10 (the +Z direction, one direction of the first direction). The first under layer 40 is formed of, for example, nitrogen-added silicon carbide (SiCN).

The first interlayer insulating layer 41 is provided above the first under layer 40. A thickness (thickness in the Z direction) of the first interlayer insulating layer 41 is larger than that of the first under layer 40. In the present embodiment, the first interlayer insulating layer 41 is formed of, for example, silicon oxide (SiO).

A first recess portion 48 that penetrates the first connection layer 22 in the Z direction is formed in the first connection layer 22. The first recess portion 48 overlaps some of the first wiring layers 21 in a plan view viewed from the Z direction. A shape of the first recess portion 48 in a plan view may be changed as appropriate, such as a rectangular shape, a circular shape, or a polygonal shape. The first recess portion 48 is formed in a stepped shape whose outer shape in a plan view gradually decreases in a downward direction (the −Z direction, the other direction of the first direction). Specifically, the first recess portion 48 includes a first pad recess portion 50 and a first via 51.

The first pad recess portion 50 is formed in a tapered shape whose outer shape in a plan view gradually decreases in the downward direction. An upper end of the first pad recess portion 50 reaches an upper end of the first interlayer insulating layer 41. A lower end of the first pad recess portion 50 is located in the first interlayer insulating layer 41.

The first via 51 extends in the downward direction from a central portion in a plan view in the first pad recess portion 50. The first via 51 is formed in a tapered shape whose outer shape in a plan view gradually decreases in the downward direction. The first via 51 penetrates the first interlayer insulating layer 41 and the first under layer 40 in the Z direction. A lower end of the first via 51 reaches a lower surface of the first under layer 40. That is, the first wiring layers 21 described above are connected to the first pad portion 43 in the first recess portion 48 through the lower end of the first via 51.

The first insulating layer 42 is formed along an inner surface of the first recess portion 48, and is also formed between the first pad portion 43 and the first wiring layers 21. The first insulating layer 42 functions as a barrier metal that prevents diffusion of the first pad portion 43 to a periphery of the first pad portion 43. In the present embodiment, the first insulating layer 42 is formed of, for example, tantalum (Ta) or tantalum nitride (TaN).

The first pad portion 43 is embedded in the first recess portion 48. Specifically, the first pad portion 43 includes a first layer (first conductive layer) 62 and a first electrode 63.

The first layer 62 is formed along an inner surface of the first insulating layer 42 in the first recess portion 48. In the present embodiment, a film thickness (thickness along a normal direction on the inner surface of the first recess portion 48) of the first layer 62 is larger than a film thickness of the first insulating layer 42. However, the film thickness of the first layer 62 may be smaller than the film thickness of the first insulating layer 42. The first layer 62 is formed of a material having conductivity and an etching rate lower than that of the first electrode 63. In the present embodiment, a material containing titanium (Ti) is preferably used as such a material. The first layer 62 may be formed of a material having insulating properties. In this case, the first layer 62 is preferably not interposed between the first wiring layers 21 and the first electrode 63.

An upper end of the first layer 62 is located below the upper end of the first interlayer insulating layer 41. Therefore, in the first recess portion 48, a housing portion 65 is formed between the inner surface of the first recess portion 48 (the inner surface of the first insulating layer 42) and the upper end of the first layer 62. An inner surface of the housing portion 65 faces upward and an inner side of the first recess portion 48. A portion surrounded by a virtual line L1 that extends along an inner surface of the first layer 62, a virtual line L2 that extends along the upper end of the first interlayer insulating layer 41, the upper end of the first layer 62, and the inner surface of the first insulating layer 42 is a volumetric capacity S of the housing portion 65.

In the present embodiment, the housing portion 65 has a uniform depth in the Z direction over an entire periphery of the first recess portion 48. In the present embodiment, the depth of the housing portion 65 is larger than the film thickness of the first layer 62. However, the housing portion 65 may be formed at least partially around the first recess portion 48. Further, the depth of the housing portion 65 in the Z direction may not be formed uniformly.

The first electrode 63 is provided in the first recess portion 48. Specifically, the first electrode 63 includes a first electrode portion (first portion) 71, a second electrode portion (second portion) 72, and a third electrode portion (second portion) 73.

The first electrode portion 71 is embedded inside the first via 51 along an inner surface shape of the first layer 62. A periphery of the first electrode portion 71 is surrounded by the first under layer 40 and the first interlayer insulating layer 41. A lower end surface (first surface) 71a of the first electrode portion 71 is electrically connected to the first wiring layers 21 via the first insulating layer 42 and the first layer 62. Side surfaces (first side surface) 71b of the first electrode portion 71 that face each other in the Y direction extend upward in directions away from each other. Therefore, a cross-sectional area of the first electrode portion 71 in an XY plane gradually increases upwardly.

The second electrode portion 72 is embedded inside the first pad recess portion 50 along the inner surface shape of the first layer 62. A periphery of the second electrode portion 72 is surrounded by the first interlayer insulating layer 41. The second electrode portion 72 is integrally provided above the first electrode portion 71. A lower end surface 72a (second surface: a boundary portion with the first electrode portion 71) of the second electrode portion 72 is electrically connected to an upper end of the first electrode portion 71. The lower end surface 72a of the second electrode portion 72 is spaced upward from the lower end surface 71a of the first electrode portion 71 and projects toward an outer peripheral side from the upper end of the first electrode portion 71. A minimum length (second length) D2 of the second electrode portion 72 in the Y direction is longer than a maximum length (first length) D1 of the first electrode portion 71 in the Y direction. The minimum length D2 of the second electrode portion 72 is a length of the lower end surface 72a of the second electrode portion 72, and is an interval between the inner surfaces of the first layer 62. The maximum length D1 of the first electrode portion 71 is a length of the upper end of the first electrode portion 71 in the Y direction.

Side surfaces (fourth surface) 72b of the second electrode portion 72 that face each other in the Y direction extend upward in directions away from each other. Therefore, a cross-sectional area of the second electrode portion 72 gradually increases upwardly. The cross-sectional area of the second electrode portion 72 in the XY plane is larger than that of the first electrode portion 71. In the present embodiment, a maximum cross-sectional area of the second electrode portion 72 is preferably three times or more a maximum cross-sectional area of the first electrode portion 71.

The third electrode portion 73 is integrally provided above the second electrode portion 72 inside the first pad recess portion 50. A length of an upper surface (third surface, first region) 73b of the third electrode portion 73 in the Y direction is larger than a length of the lower end surface 72a of the second electrode portion 72 in the Y direction. In the present embodiment, a case where a third surface of the first electrode 63 is the upper surface 73b of the third electrode portion 73 is described. In this case, the upper surface 73b may be, for example, a surface including one line segment appearing in a cross section that passes through a boundary portion between the first module 10 and the second module 11 and is orthogonal to the Z direction. Further, the third surface of the first electrode 63 may be a surface of the third electrode portion 73 orthogonal to the Z direction at an optional position in the Z direction.

A minimum length (third length) D3 of the third electrode portion 73 in the Y direction is longer than the maximum length D2 of the second electrode portion 72 in the Y direction. In the third electrode portion 73, side surfaces 73a that face each other in the Y direction extend upward in directions away from each other. Therefore, in the present embodiment, the minimum length of the third electrode portion 73 is a length of a lower end of the third electrode portion 73 in the Y direction. A cross-sectional area of the third electrode portion 73 in the XY plane is larger than that of the second electrode portion 72. Specifically, the cross-sectional area of the third electrode portion 73 gradually increases upwardly.

A portion of the third electrode portion 73 that projects toward an outer peripheral side from the second electrode portion 72 constitutes an projection portion 74 located above the first layer 62. In the present embodiment, the projection portion 74 is formed over an entire periphery of the third electrode portion 73. The projection portion 74 is embedded in the housing portion 65 described above without a gap. Therefore, a part of the first electrode 63 is provided between the upper end of the first layer 62 and the upper surface 73b of the third electrode portion 73.

Accordingly, the first insulating layer 42 described above extends between the lower end surface 71a of the first electrode portion 71 and the first wiring layers 21, between the side surfaces 71b of the first electrode portion 71 and the first interlayer insulating layer 41, between the lower end surface 72a of the second electrode portion 72 and the first interlayer insulating layer 41, between the side surfaces 72b of the second electrode portion 72 and the first interlayer insulating layer 41, and between the side surfaces 73a of the third electrode portion 73 and the first interlayer insulating layer 41.

On the other hand, the first layer 62 described above extends between the lower end surface 71a of the first electrode portion 71 and the first wiring layers 21, between the side surfaces 71b of the first electrode portion 71 and the first interlayer insulating layer 41, between the lower end surface 72a of the second electrode portion 72 and the first interlayer insulating layer 41, and between the side surfaces 72b of the second electrode portion 72 and the first interlayer insulating layer 41. In this case, a portion of the first layer 62 located between the side surfaces 72b of the second electrode portion 72 and the first interlayer insulating layer 41 constitutes a first portion (first conductive layer) 62a. A portion of the first layer 62 located between the lower end surface 72a of the second electrode portion 72 and the first interlayer insulating layer 41 constitutes a second portion (third conductive layer) 62b. Further, a portion of the first layer 62 located between the side surfaces 71b of the first electrode portion 71 and the first interlayer insulating layer 41 constitutes a third portion (fourth conductive layer) 62c.

Therefore, the first layer 62 is not interposed between the third electrode portion 73 and the first insulating layer 42 in a plane that passes through the third electrode portion 73 in the XY plane. On the other hand, the first layer 62 is interposed between the first electrode portion 71 and the first insulating layer 42 in a plane that passes through the first electrode portion 71 in the XY plane.

The second module 11 is, for example, a cell module. The second module 11 includes a plurality of memory cells charged and discharged by the CMOS circuits described above. The second module 11 includes, for example, a second insulating film 100, second wiring layers 101, and a second connection layer 102.

The second insulating film 100 is formed of, for example, silicon oxide (SiO). The second insulating film 100 may constitute a part of a second wafer in the second module 11. In the present embodiment, the second wafer may be a member where the second wiring layers 101 are provided, and may not be limited to a substrate of the second module 11, or may be a stacked body including a member where the memory cells are stacked in addition to the substrate. Further, the second wafer may or may not include the substrate.

A plurality of second wiring layers 101 are provided at intervals, for example, in the X direction and the Y direction. The second wiring layers 101 are partitioned by the second insulating film 100.

The second connection layer 102 is located below the second insulating film 100 described above. The second connection layer 102 is bonded to the first connection layer 22 described above, and the first module 10 and the second module 11 are connected to each other. Similar to the first connection layer 22, the second connection layer 102 includes a second under layer 110, a second interlayer insulating layer (second insulating layer) 111, a second insulating layer 112, and a second pad portion 113. The second connection layer 102 is symmetrical with the first connection layer 22 described above in an up-down direction with respect to the XY plane. In the following description, a description of a configuration similar to that of the first connection layer 22 described above will be omitted as appropriate.

A second recess portion 120 that penetrates the second connection layer 102 in the Z direction is formed in the second connection layer 102. The second recess portion 120 faces the first recess portion 48 described above in the Z direction.

A second pad recess portion 130 of the second recess portion 120 is formed in a tapered shape whose outer shape in a plane view gradually decreases upwardly. An upper end of the second pad recess portion 130 is located in the second interlayer insulating layer 111. A lower end of the second pad recess portion 130 reaches a lower surface of the second interlayer insulating layer 111.

A second via 131 of the second recess portion 120 extends upward from a central portion in a plan view in the second pad recess portion 130. The second via 131 is formed in a tapered shape whose outer shape in a plan view gradually decreases upwardly. The second via 131 penetrates the second interlayer insulating layer 111 and the second under layer 110 in the Z direction. An upper end of the second via 131 reaches an upper surface of the second under layer 110. That is, the second wiring layers 101 described above are connected to the second pad portion 113 in the second recess portion 120 through the upper end of the second via 131.

The second insulating layer 112 is formed along an inner surface of the second recess portion 120, and is also formed between the second pad portion 113 and the second wiring layers 101.

The second pad portion 113 is embedded in the second recess portion 120. Specifically, the second pad portion 113 includes a second layer (second conductive layer) 142 and a second electrode (electrode) 143.

The second layer 142 is formed along an inner surface of the second insulating layer 112 in the second recess portion 120. The second layer 142 is formed of a material having conductivity and an etching rate lower than that of the second electrode 143.

A lower end of the second layer 142 is located above a lower surface of the second interlayer insulating layer 111. Therefore, in the second recess portion 120, a housing portion 149 is formed between the inner surface of the second recess portion 120 (inner surface of the second insulating layer 112) and the lower end of the second layer 142. An inner surface of the housing portion 149 faces downward and an inner side of the second recess portion 120.

The second electrode 143 is provided in the second recess portion 120. Specifically, the second electrode 143 includes a fourth electrode portion 150, a fifth electrode portion (third portion) 151, and a sixth electrode portion (fourth portion) 152.

The fourth electrode portion 150 is provided above the third electrode portion 73 inside the second pad recess portion 130. A length of a lower surface (seventh surface) 150b of the fourth electrode portion 150 in the Y direction is larger than a length of an upper end surface 151b of the fifth electrode portion 151 in the Y direction. In the present embodiment, a case where the seventh surface of the second electrode 143 is the lower surface 150b of the fourth electrode portion 150 is described. In this case, the lower surface 150b may be, for example, a surface including one line segment appearing in a cross section that passes through the boundary portion between the first module 10 and the second module 11 and is orthogonal to the Z direction. Further, the seventh surface of the second electrode 143 may be a surface of the fourth electrode portion 150 orthogonal to the Z direction at an optional position in the Z direction.

A minimum length D4 of the fourth electrode portion 150 in the Y direction is larger than the maximum length D2 of the second electrode portion 72. A cross-sectional area of the fourth electrode portion 150 in the XY plane is larger than that of the second electrode portion 72. In the present embodiment, side surfaces 150a of the fourth electrode portion 150 that face each other in the Y direction extend downward in directions away from each other. In the shown example, the cross-sectional area of the fourth electrode portion 150 gradually increases downwardly.

A portion of the fourth electrode portion 150 located below the second layer 142 constitutes an projection portion 154 that projects toward an outer peripheral side from inner surfaces of the second layer 142. In the present embodiment, the projection portion 154 is formed over an entire periphery of the fourth electrode portion 150. The projecting portion 154 is embedded in the housing portion 149 described above without a gap.

The fifth electrode portion 151 is embedded inside the second pad recess portion 130 along an inner surface shape of the second layer 142. A periphery of the fifth electrode portion 151 is surrounded by the second interlayer insulating layer 111. The fifth electrode portion 151 is integrally provided above the fourth electrode portion 150. A lower end of the fifth electrode portion 151 is electrically connected to an upper end of the fourth electrode portion 150. A cross-sectional area of the fifth electrode portion 151 in the XY plane is smaller than that of the fourth electrode portion 150. A minimum length (fourth length) D5 of the fifth electrode portion 151 in the Y direction is larger than the maximum length D4 of the fourth electrode portion 150. The minimum length D5 of the fifth electrode portion 151 is a length of the upper end surface (sixth surface) 151b of the fifth electrode portion 151, and is an interval between the inner surfaces of the second layer 142. In a YZ plane, side surfaces (eighth surface) 151a of the fifth electrode portion 151 that face each other in the Y direction extend downward in directions away from each other. Therefore, a cross-sectional area of the fifth electrode portion 151 gradually increases downwardly.

The sixth electrode portion 152 is embedded inside the second via 131 along the inner surface shape of the second layer 142. A periphery of the sixth electrode portion 152 is surrounded by the second under layer 110 and the second interlayer insulating layer 111. An upper end surface (fifth surface) 152a of the sixth electrode portion 152 is electrically connected to the second wiring layers 101 via the second insulating layer 112 and the second layer 142. Side surfaces (second side surface) 152b of the sixth electrode portion 152 that face each other in the Y direction extend downward in directions away from each other. The minimum length D4 of the fifth electrode portion 151 in the Y direction is larger than a maximum length (fifth length) D5 of the sixth electrode portion 152 in the Y direction. Therefore, a cross-sectional area of the sixth electrode portion 152 in the XY plane gradually increases downwardly.

Accordingly, the second insulating layer 112 described above extends between the upper end surface 152a of the sixth electrode portion 152 and the second wiring layers 101, between the side surfaces 152b of the sixth electrode portion 152 and the second interlayer insulating layer 111, between the upper end surface 151b of the fifth electrode portion 151 and the second interlayer insulating layer 111, between the side surfaces 151a of the fifth electrode portion 151 and the second interlayer insulating layer 111, and between the side surfaces 150a of the fourth electrode portion 150 and the second interlayer insulating layer 111.

On the other hand, the second layer 142 described above extends between the upper end surface 152a of the sixth electrode portion 152 and the second wiring layers 101, between the side surfaces 152b of the sixth electrode portion 152 and the second interlayer insulating layer 111, between the upper end surface 151b of the fifth electrode portion 151 and the second interlayer insulating layer 111, and between the side surfaces 151a of the fifth electrode portion 151 and the second interlayer insulating layer 111. In this case, a portion of the second layer 142 located between the side surfaces 151a of the fifth electrode portion 151 and the second interlayer insulating layer 111 constitutes a fourth portion (second conductive layer) 142a. A portion of the second layer 142 located between the upper end surface 151b of the fifth electrode portion 151 and the second interlayer insulating layer 111 constitutes a fifth portion 142b. Further, a portion of the second layer 142 located between the side surfaces 152b of the sixth electrode portion 152 and the second interlayer insulating layer 111 constitutes a sixth portion 142c.

In the present embodiment, only the second insulating layer 112 and the fourth electrode portion 150 are located in the second pad recess portion 130 in a plane that passes through the fourth electrode portion 150 in the XY plane. On the other hand, the second insulating layer 112, the second layer 142, and the fifth electrode portion 151 are located in a plane that passes through the fifth electrode portion 151 in the XY plane.

The first module 10 and the second module 11 are connected to each other via the first connection layer 22 and the second connection layer 102. Specifically, the interlayer insulating layers 41 and 111 are bonded to each other in the Z direction. The third electrode portion 73 and the fourth electrode portion 150 are bonded to each other in a state where the pad portions 43 and 113 face each other in the Z direction.

In the present embodiment, the projection portion 74 described above is an excess portion of the third electrode portion 73 that projects toward an outer periphery side when the first pad portion 43 and the second pad portion 113 are bonded to each other. Further, the projection portion 154 described above is an excess portion of the fourth electrode portion 150 that projects toward an outer peripheral side when the first pad portion 43 and the second pad portion 113 are bonded to each other.

Next, a method for manufacturing the semiconductor device 1 described above will be described. In the following description, a step of manufacturing the first connection layer 22 and steps of stacking the first module 10 and the second module 11 will be mainly described.

FIGS. 2 to 11 are step diagrams illustrating steps of manufacturing the semiconductor device 1.

Figure 2:
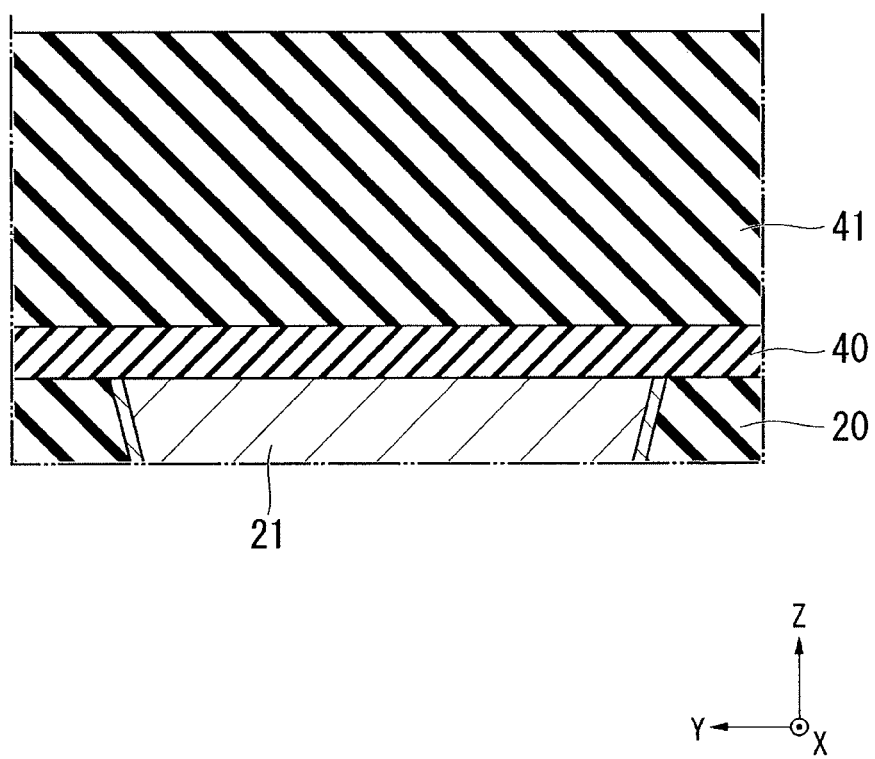
FIG. 2 is a step diagram illustrating a step of manufacturing the semiconductor device according to the embodiment.

As shown in FIG. 2, the first under layer 40 and the first interlayer insulating layer 41 are sequentially stacked above the first insulating film 20 on which the first wiring layers 21 are formed (first film-forming step). The first under layer 40 and the first interlayer insulating layer 41 are formed by, for example, a chemical vapor deposition (CVD) method, or a sputtering method.

Thereafter, the first pad portion 43 is formed in the first under layer 40 and the first interlayer insulating layer 41. In the present embodiment, the first pad portion 43 is formed by, for example, a dual damascene method.

Figure 3:
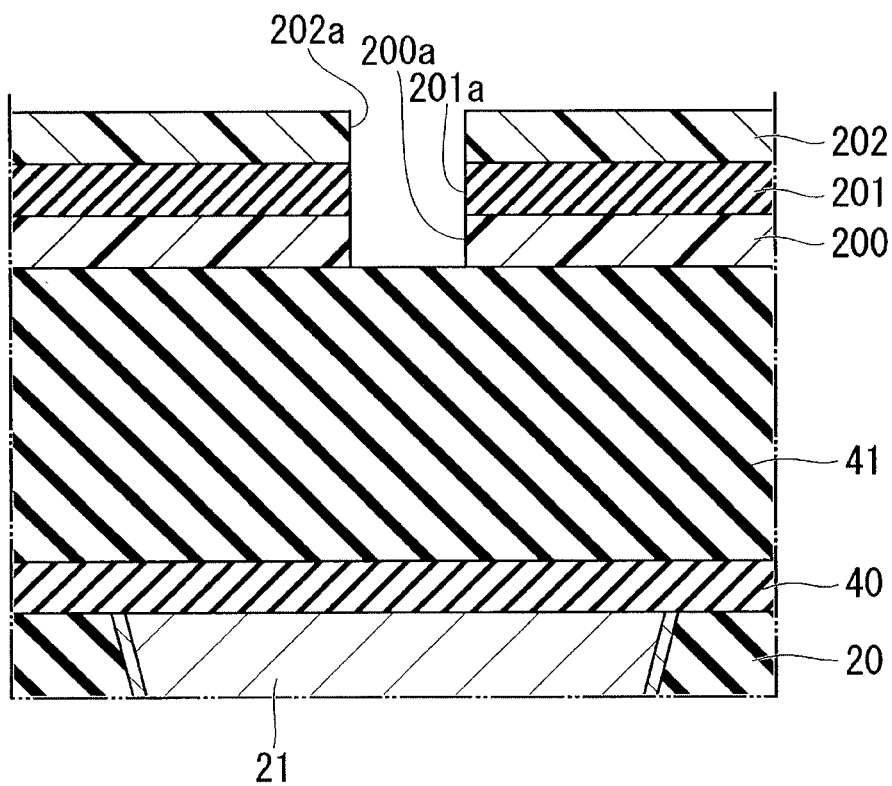
FIG. 3 is a step diagram illustrating a step of manufacturing the semiconductor device according to the embodiment.
Figure 3:
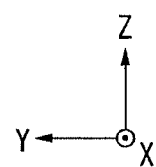

First, as shown in FIG. 3, the first via 51 (see FIG. 1) is formed in the first under layer 40 and the first interlayer insulating layer 41 (via-forming step). Specifically, first, a lower layer resist film 200, a spin on glass (SOG) layer 201, and an upper layer resist film 202 are sequentially formed above the first interlayer insulating layer 41 (so-called stacked mask process (SMAP)). Thereafter, the upper layer resist film 202 is exposed and developed, thereby forming an opening 202a corresponding to the first via 51 in the upper layer resist film 202. Thereafter, the SOG film 201 is patterned by etching and the like through the opening 202a, thereby forming an opening 201a corresponding to the first via 51 in the SOG film 201. Thereafter, the lower layer resist film 200 is patterned by etching and the like through the opening 201a, thereby forming an opening 200a corresponding to the first via 51 in the lower layer resist film 200.

Figure 4:
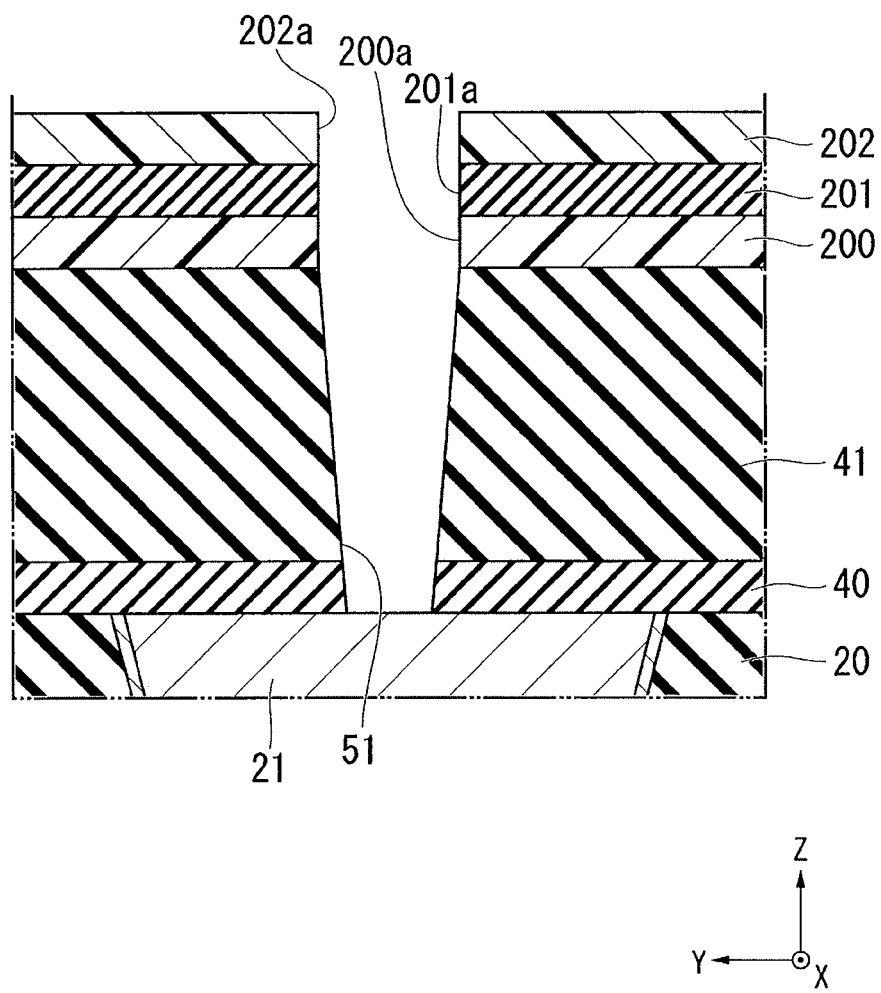
FIG. 4 is a step diagram illustrating a step of manufacturing the semiconductor device according to the embodiment.

Thereafter, as shown in FIG. 4, the first under layer 40 and the first interlayer insulating layer 41 are etched using the lower layer resist film 200 described above as a mask (etching step). The etching step is performed by, for example, reactive ion etching (RIE). Accordingly, the first via 51 described above is formed. The lower layer resist film 200 is peeled off by ashing after the etching step.

Figure 5:
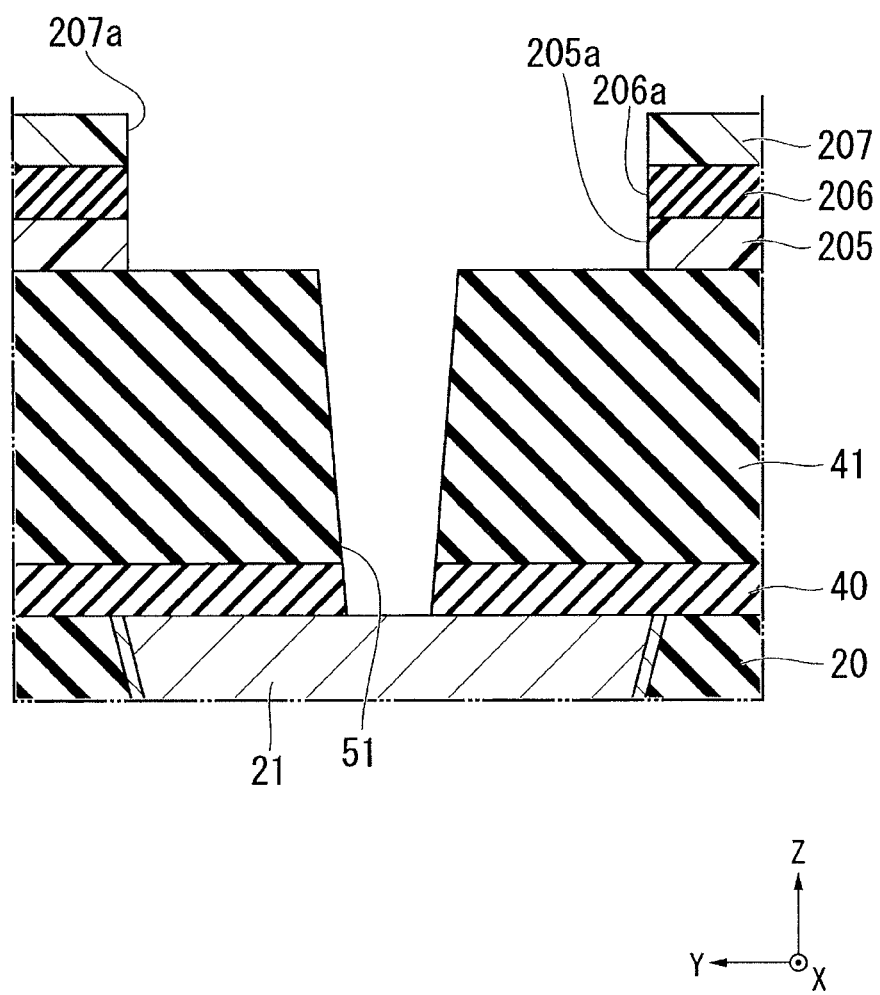
FIG. 5 is a step diagram illustrating a step of manufacturing the semiconductor device according to the embodiment.

Thereafter, as shown in FIG. 5, the first pad recess portion 50 (see FIG. 1) is formed in the first interlayer insulating layer 41 (pad-recess-portion-forming step). Specifically, similar to the via-forming step described above, a lower layer is patterned by forming a lower layer resist film 205, an SOG film 206, and an upper layer resist film 207, and then using openings in the upper layers (for example, an opening 206a and an opening 207a) as masks. Accordingly, an opening 205a corresponding to the first pad recess portion 50 is formed in the lower layer resist film 205.

Figure 6:
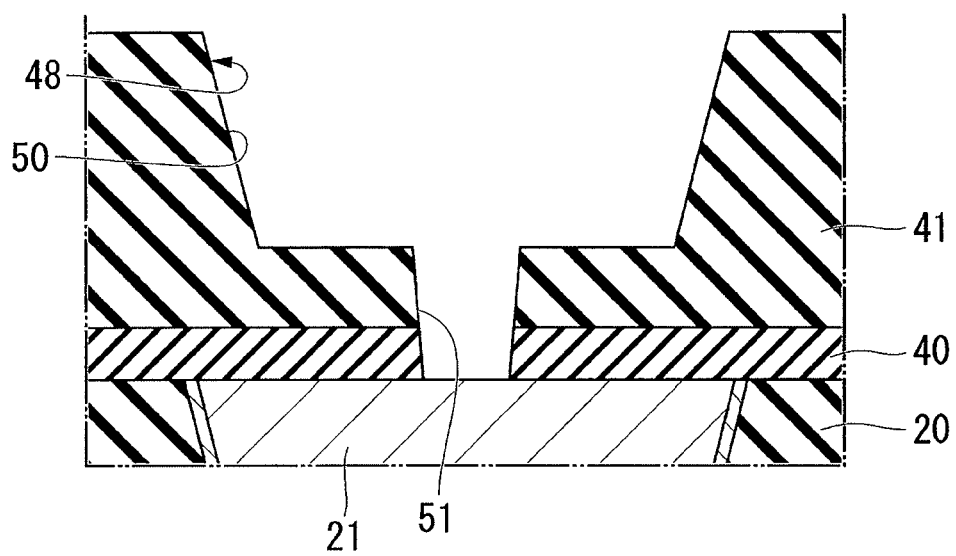
FIG. 6 is a step diagram illustrating a step of manufacturing the semiconductor device according to the embodiment.

Thereafter, as shown in FIG. 6, the lower layer resist film 205 is used as a mask to etch the first interlayer insulating layer 41 (etching step). The etching step is performed by, for example, RIE. Accordingly, the first pad recess portion 50 described above is formed. Thereafter, the lower layer resist film 205 is peeled off by ashing after the etching step. Accordingly, the first recess portion 48 is formed.

Figure 7:
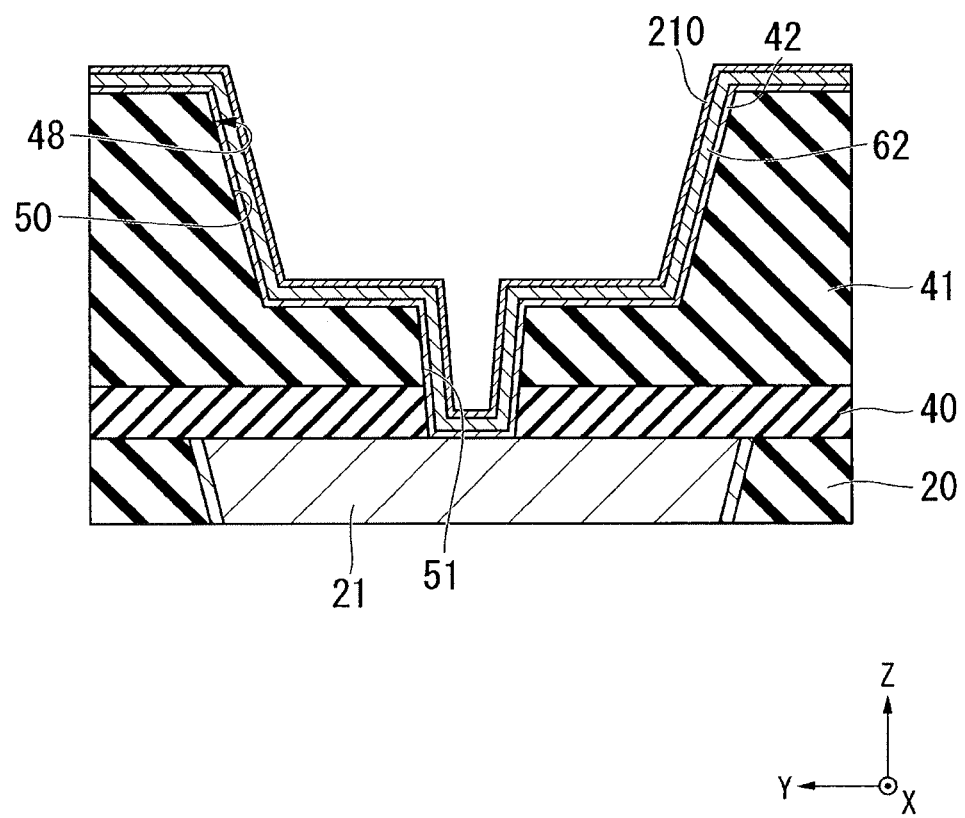
FIG. 7 is a step diagram illustrating a step of manufacturing the semiconductor device according to the embodiment.

Next, as shown in FIG. 7, the first insulating layer 42, the first layer 62, and a seed layer 210 are sequentially formed on the inner surface of the first recess portion 48 and the first interlayer insulating layer 41 (second film-forming step). The seed layer 210 functions as an electrode film for electroplating to be performed later, and is formed of a material same as a material (for example, a material containing copper (Cu)) of the first electrode 63 (see FIG. 1). The first insulating layer 42, the first layer 62, and the seed layer 210 are formed by, for example, the CVD method, or the sputtering method.

Figure 8:
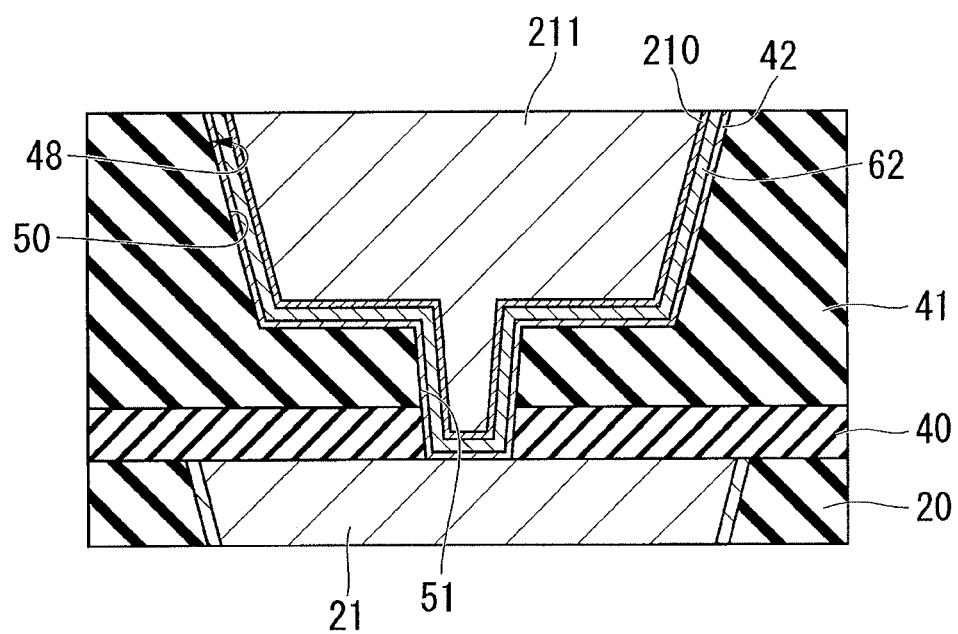
FIG. 8 is a step diagram illustrating a step of manufacturing the semiconductor device according to the embodiment.
Figure 8:
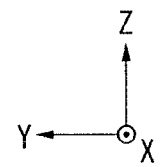

Thereafter, as shown in FIG. 8, a plating layer 211 is formed in the first recess portion 48 (first-electrode-forming step). Specifically, the electroplating is performed, by using the seed layer 210 as an electrode film, on a part of the first module 10 on which the seed layer 210 described above is formed. Thereafter, the plating layer 211 is deposited above the seed layer 210.

Then, after an annealing treatment is performed on the second module 11, the plating layer 211 is planarized by chemical mechanical polishing (CMP) and the like (post-treatment step).

Figure 9:
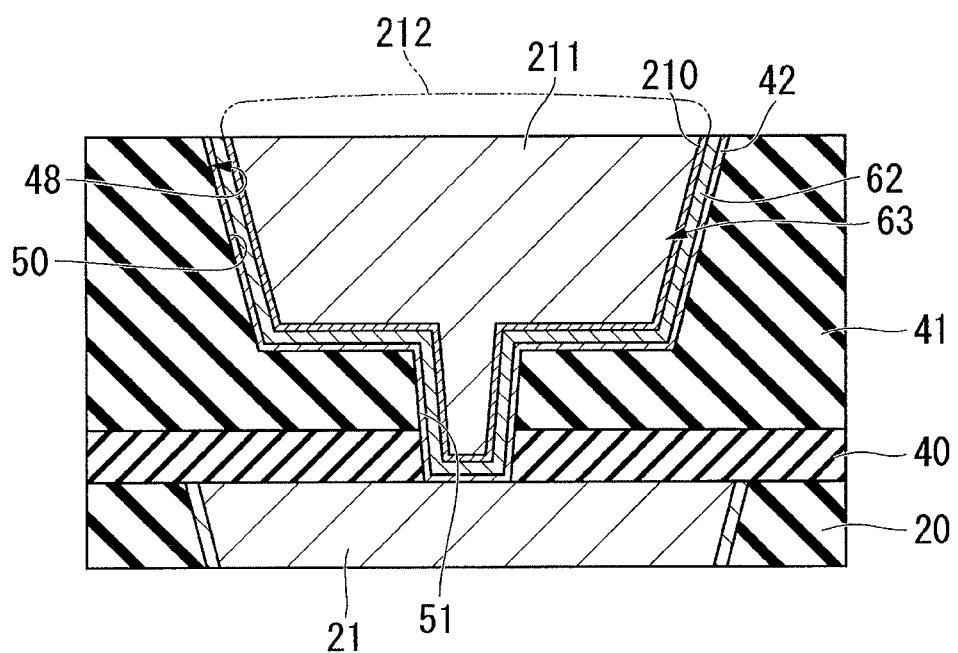
FIG. 9 is a step diagram illustrating a step of manufacturing the semiconductor device according to the embodiment.

Thereafter, as shown in FIG. 9, a bulging portion 212 is formed above the plating layer 211 by electroless plating and the like. Similar to the plating layer 211, the bulging portion 212 is formed of copper (Cu) and the like. The bulging portion 212 rises upward with respect to an upper surface of the first interlayer insulating layer 41. Then, an intermediate body of the first electrode 63 is formed by the seed layer 210, the plating layer 211, and the bulging portion 212. The bulging portion 212 may be formed by a method other than the electroless plating.

Figure 10:
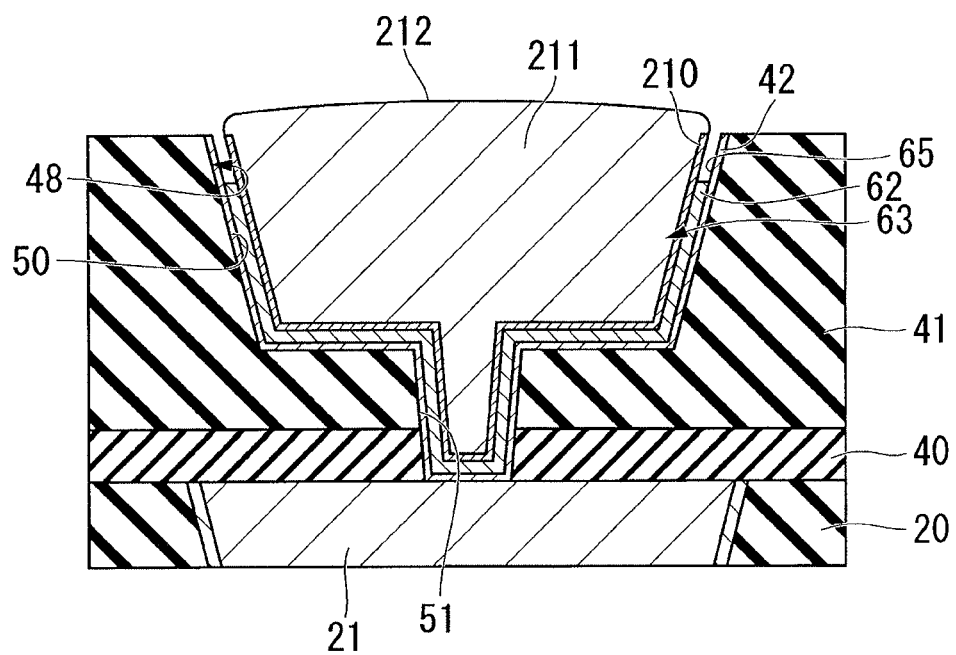
FIG. 10 is a step diagram illustrating a step of manufacturing the semiconductor device according to the embodiment.
Figure 10:
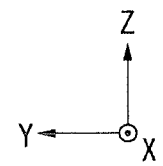

Thereafter, as shown in FIG. 10, the housing portion 65 is formed in the first recess portion 48 (housing-portion-forming step). Specifically, wet etching is performed on the first module 10. In the present embodiment, an etchant having an etching rate for the first layer 62 higher than an etching rate for the first electrode 63 (the seed layer 210, the plating layer 211, and the bulging portion 212) is used. As the etchant of this type, for example, an alkali-based etchant is used.

When the wet etching is performed in the housing-portion-forming step, the first layer 62 is etched more than the first electrode 63. Accordingly, the housing portion 65 that faces upward and the inner side of the first recess portion 48, and that is surrounded by the first insulating layer 42, the first layer 62 and the first electrode 63 is formed in the first recess portion 48.

The second connection layer 102 is formed for the second module 10 by a method similar to the method for forming the first connection layer 22 described above.

Figure 11:
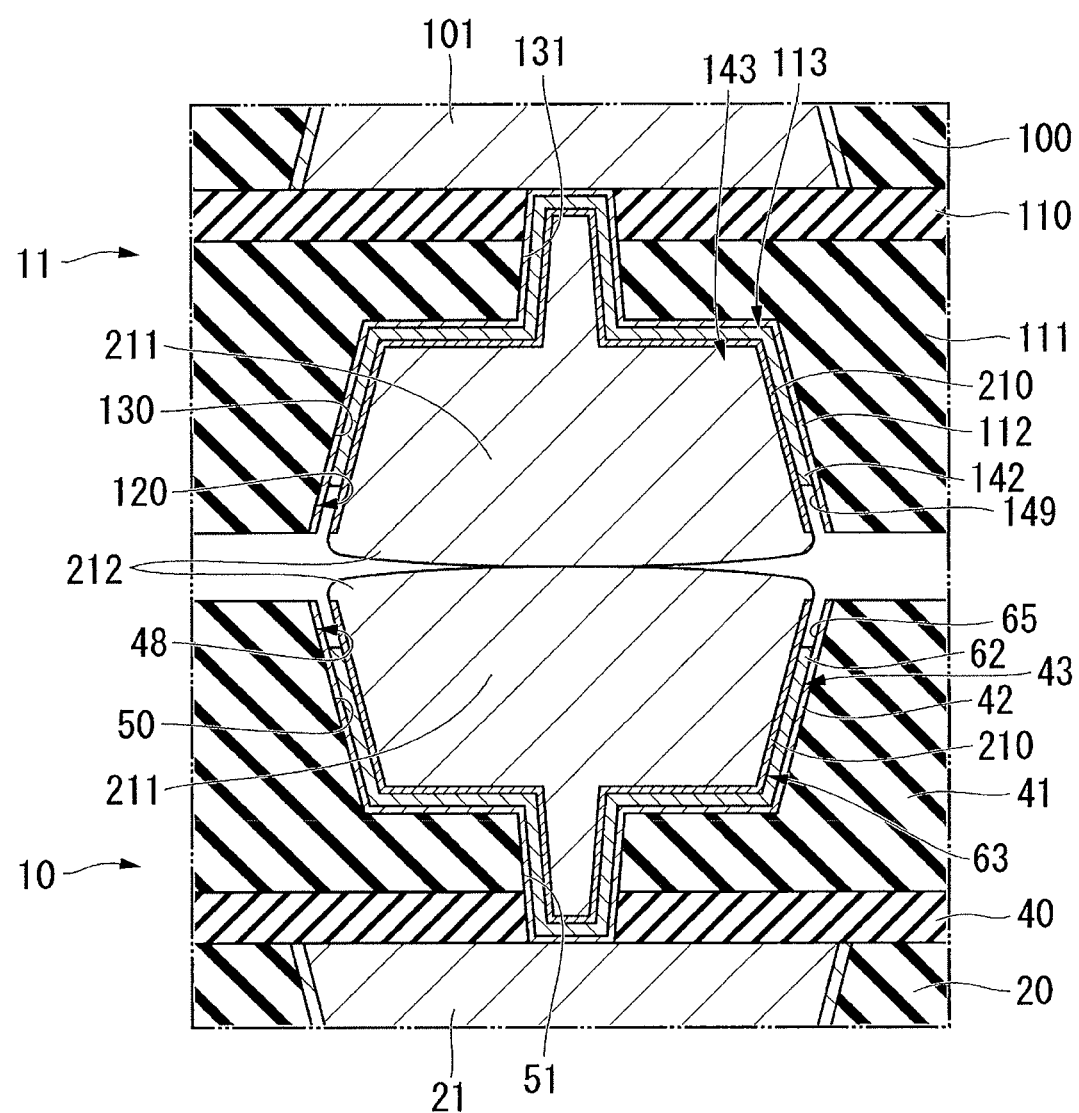
FIG. 11 is a step diagram illustrating a step of manufacturing the semiconductor device according to the embodiment.

Thereafter, as shown in FIG. 11, the first module 10 and the second module 11 are bonded to each other (bonding step). Specifically, an annealing treatment is performed in a state where the pad portions 43 and 113 face each other on the modules 10 and 11 subjected to pretreatments such as a plasma treatment and a water washing treatment. The annealing treatment is performed, for example, at a temperature of 250° C. to 400° C. for about 1 hour. Thereafter, the first module 10 and the second module 11 are brought close to each other to crimp the first module 10 and the second module 11 together. Accordingly, in the first module 10 and the second module 11, the interlayer insulating layers 41 and 101 are bonded (covalently bonded) to each other, and the electrodes 63 and 143 of the pad portions 43 and 113 are bonded (metal-bonded) to each other. Thereafter, the bonding step is completed by returning the temperature of the first module 10 and the second module 11 to a room temperature.

When the temperatures of the first module 10 and the second module 11 decrease after the bonding step described above, the electrodes 63 and 143 mainly contract. In this case, if volumes of the electrodes 63 and 143 are insufficient with respect to volumetric capacities of the first recess portion 48 and the second recess portion 120, a void may be generated in the first recess portion 48 or the second recess portion 120 due to stress migration caused by the contraction of the electrodes 63 and 143. In particular, when the void is generated in the vias 51 and 131, reliability of conduction may be lowered, for example, an open defect may be generated.

On the other hand, if the first module 10 and the second module 11 are bonded to each other in a state where the electrodes 63 and 143 rise from the interlayer insulating layers 41 and 111 respectively, a portion of the electrodes 63 and 143 that is expended by crimping is interposed between the interlayer insulating layers 41 and 111. Accordingly, a bonding area between the interlayer insulating layers 41 and 111 may be reduced, and a desired bonding strength may not be obtained.

In the present embodiment, the bulging portions 212 are formed on the pad portions 43 and 113 in a state before the first module 10 and the second module 11 are bonded together. Therefore, in the bonding step described above, when crimping the first module 10 and the second module 11, the first module 10 and the second module 11 are brought close to each other while the bulging portions 212 are expended.

Here, the expended portions of the bulging portions 212 are housed in the housing portions 65 and 149. Accordingly, desired amounts of the electrodes 63 and 143 can be formed in the first recess portion 48 and the second recess portion 120 after the expended portions of the bulging portions 212 are prevented from projecting from the first recess portion 48 and the second recess portion 120.

Accordingly, in the present embodiment, the projection portion 74 of the first pad portion 43 is interposed between the first layer 62 and the second pad portion 113.

With this configuration, a portion above the first layer 62 is opened as the housing portion 65 before the first pad portion 43 and the second pad portion 113 are bonded together, whereby an excess portion of the first pad portion 43 expended during the bonding can be housed as the projection portion 74 in the housing portion 65. That is, since the first electrode 63 can previously project from the upper surface of the first interlayer insulating layer 41 in a state before the first pad portion 43 and the second pad portion 113 are bonded together, the sufficient volume of the first electrode 63 after the bonding can be obtained. Accordingly, the generation of the void caused by the contraction of the first electrode 63 after the bonding can be prevented, and the open defect and the like can be prevented. Further, since the expended first electrode 63 can be prevented from projecting between the interlayer insulating layers 41 and 111, a bonding strength between the interlayer insulating layers 41 and 111 can be enhanced.

Further, the projection portion 74 is formed, whereby a sufficient bonding area between the pad portions 43 and 113 can be provided. Accordingly, high resistance of the first pad portion 43 due to the formation of the first layer 62 can be prevented.

As a result, the semiconductor device 1 in the present embodiment has the sufficient bonding strength and excellent conductivity between the modules 10 and 11.

Further, the volumetric capacity S of the housing portion 65 and a volume of the bulging portion 212 are adjusted, whereby the bonding strength generated during the contraction can also be adjusted.

In the present embodiment, the first layer 62 is formed along the inner surface of the first recess portion 48.

With this configuration, the first insulating layer 42, the first layer 62, and the first electrode 63 can be sequentially formed along the inner surface of the first recess portion 48. Accordingly, improvement in manufacturing efficiency can be achieved.

Further, the first electrode 63 expended toward the outer peripheral side can be housed in the housing portion 65 before reaching the interlayer insulating layers 41 and 111. Accordingly, the projecting of the first electrode 63 toward the interlayer insulating layers 41 and 111 can be effectively prevented.

In the present embodiment, the film thickness of the first layer 62 is smaller than the depth of the housing portion 65.

With this configuration, it is easy to enhance the volumetric capacity of the housing portion 65 after the cross-sectional area of the first electrode 63 orthogonal to the Z direction. As a result, the high resistance of the first pad portion 43 due to the formation of the first layer 62 can be prevented.

In the present embodiment, since the first layer 62 has conductivity, the high resistance of the first pad portion 43 can be prevented as compared with a case where the first layer 62 is formed of an insulating material.

Further, the first layer 62 is formed of a material having an etching rate higher than that of the first electrode 63.

With this configuration, the first layer 62 and the first electrode 63 are formed and then collectively etched, whereby the housing portion 65 can be formed above the first layer 62. Accordingly, a decrease in the manufacturing efficiency due to addition of the first layer 62 can be prevented.

In the present embodiment, during the bonding step, the first pad portion 43 and the second pad portion 113 are pressed against each other. Thereby, the first pad portion 43 and the second pad portion 113 are bonded to each other, and the first interlayer insulating layer 41 and the second interlayer insulating layer 111 are bonded to each other while a part of the electrodes 63 and 143 are expended to the housing portion 65.

With this configuration, the housing portion 65 is previously formed before the bonding step, whereby the first module 10 and the second module 11 are brought close to each other while the bulging portions 212 are expended during the bonding step. The expended portions of the bulging portions 212 are housed in the housing portion 65. Accordingly, the desired amounts of the electrodes 63 and 143 can be formed in the first recess portion 48 and the second recess portion 120 after the expended portions of the bulging portions 212 are prevented from projecting from the first recess portion 48 and the second recess portion 120.

Figure 12:
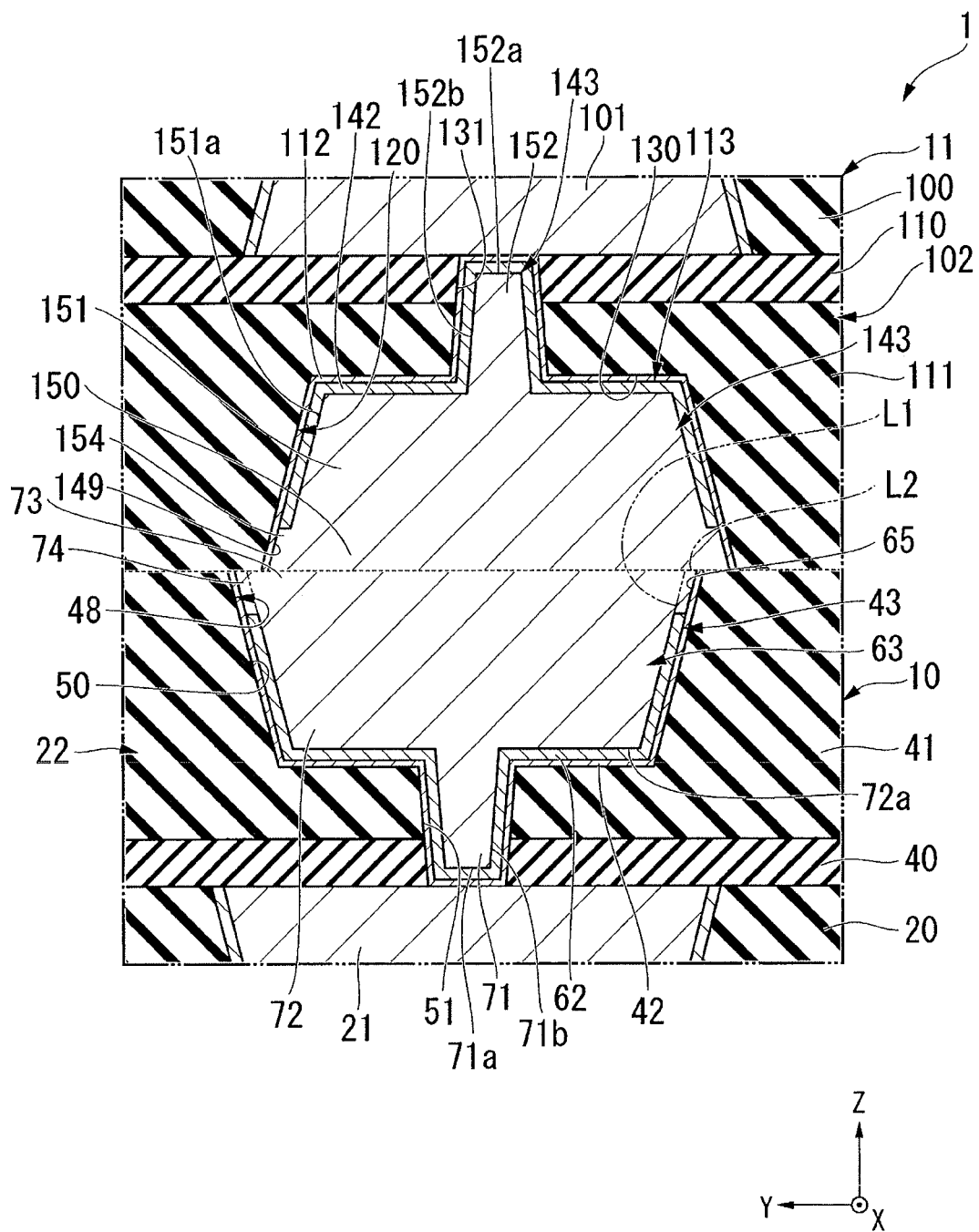
FIG. 12 is an enlarged cross-sectional view corresponding to FIG. 1 according to a modification of the embodiment.

In the embodiment described above, although the configuration in which the pad portions 43 and 113 overlap each other as a whole is described, the present disclosure is not limited to this configuration. For example, as shown in FIG. 12, at least a part of the pad portions 43 and 113 may overlap each other in a plan view.

Figure 13:
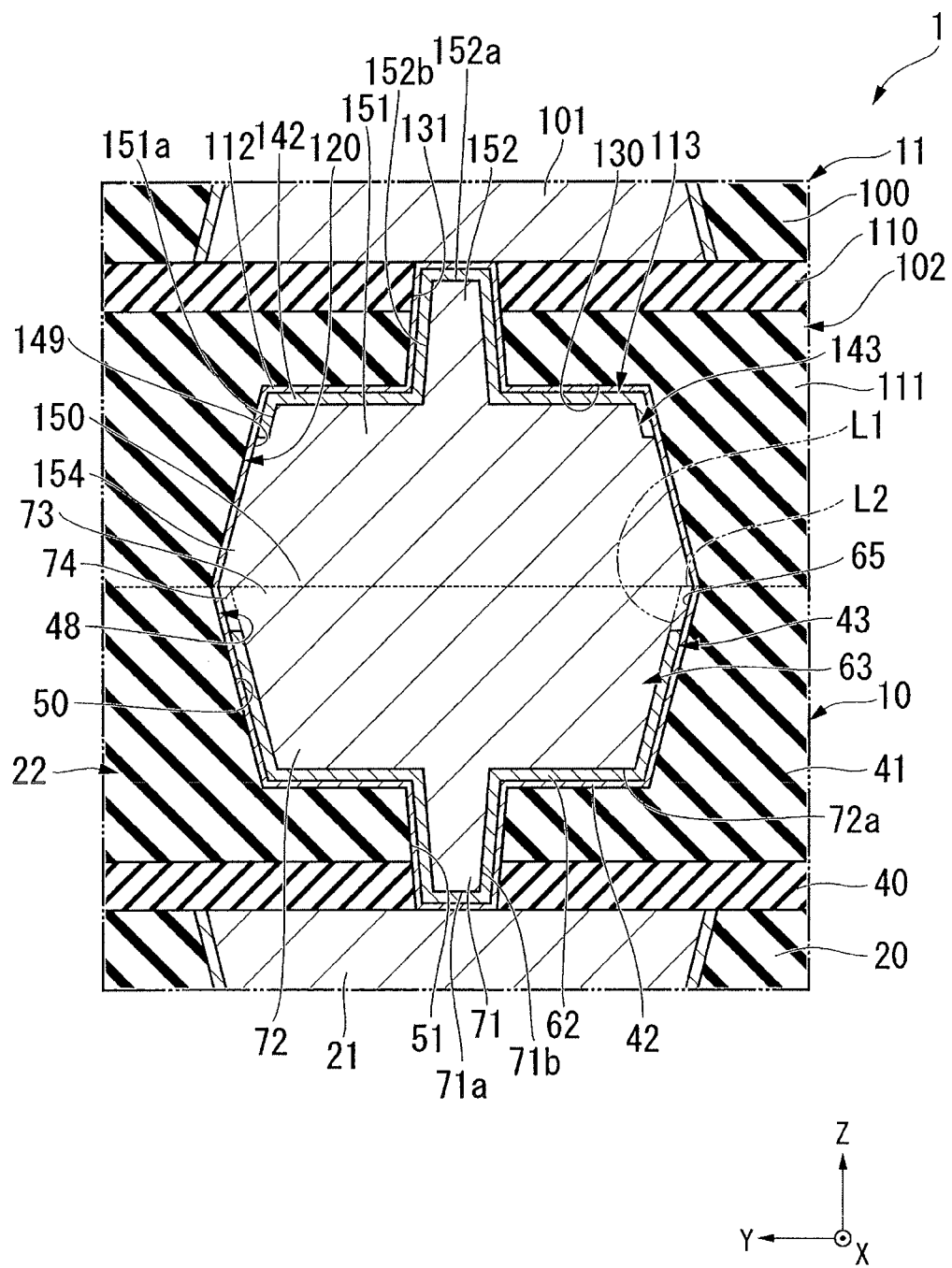
FIG. 13 is an enlarged cross-sectional view corresponding to FIG. 1 according to a modification of the embodiment.

In the embodiment described above, although the case where the pad portions 43 and 113 are symmetrical with each other in the up-down direction is described, the present disclosure is not limited to this configuration. For example, as shown in FIG. 13, depths of the first layer 62 and the second layer 142 may be different between the pad portions 43 and 113.

Figure 14:
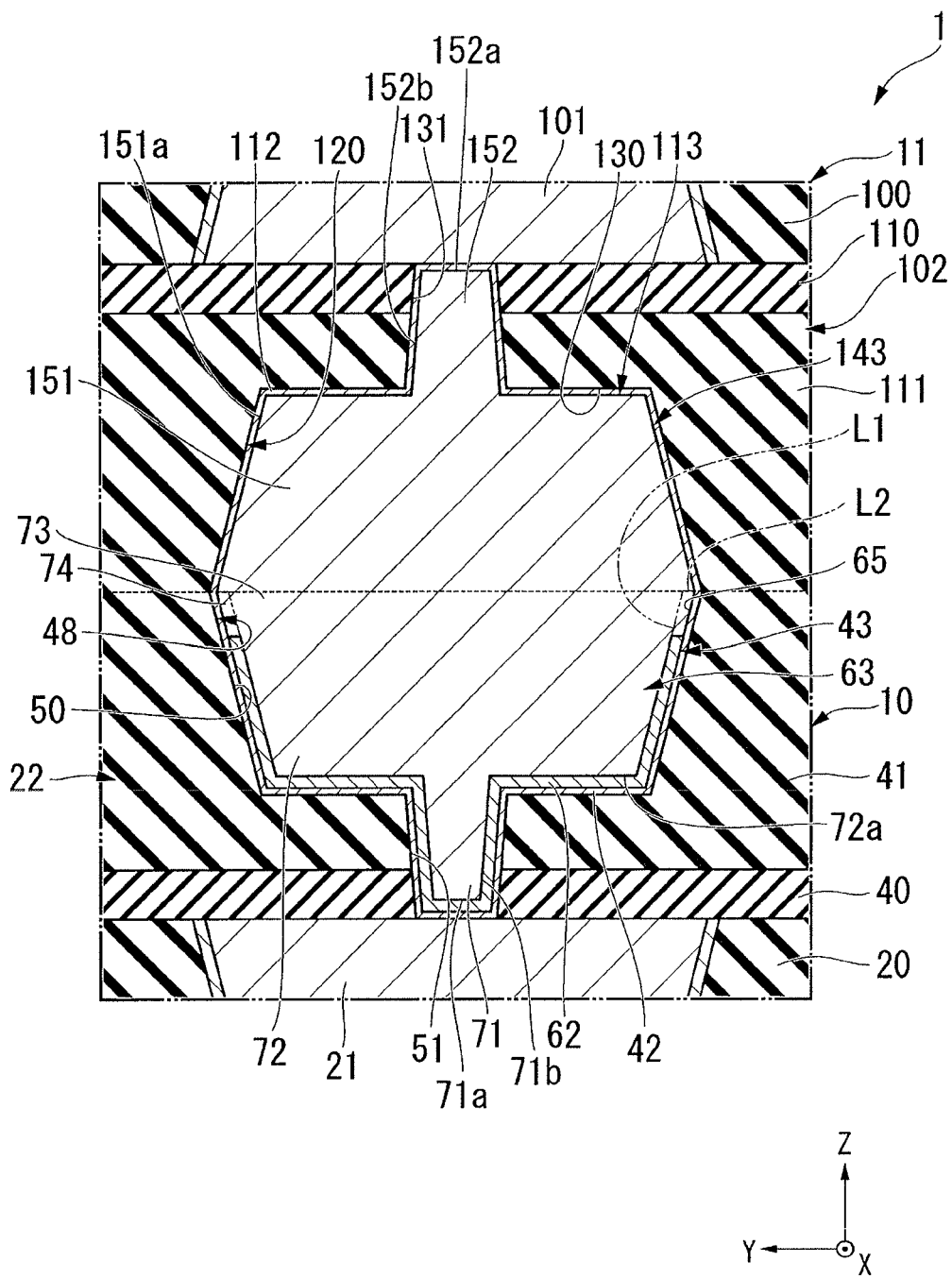
FIG. 14 is an enlarged cross-sectional view corresponding to FIG. 1 according to a modification of the embodiment.

In the embodiment described above, although the configuration in which the pad portions 43 and 113 respectively include the first layer 62 and the second layer 142 is described, the present disclosure is not limited to this configuration. For example, as shown in FIG. 14, at least only the first pad portion 43 may include the first layer 62.

Figure 15:
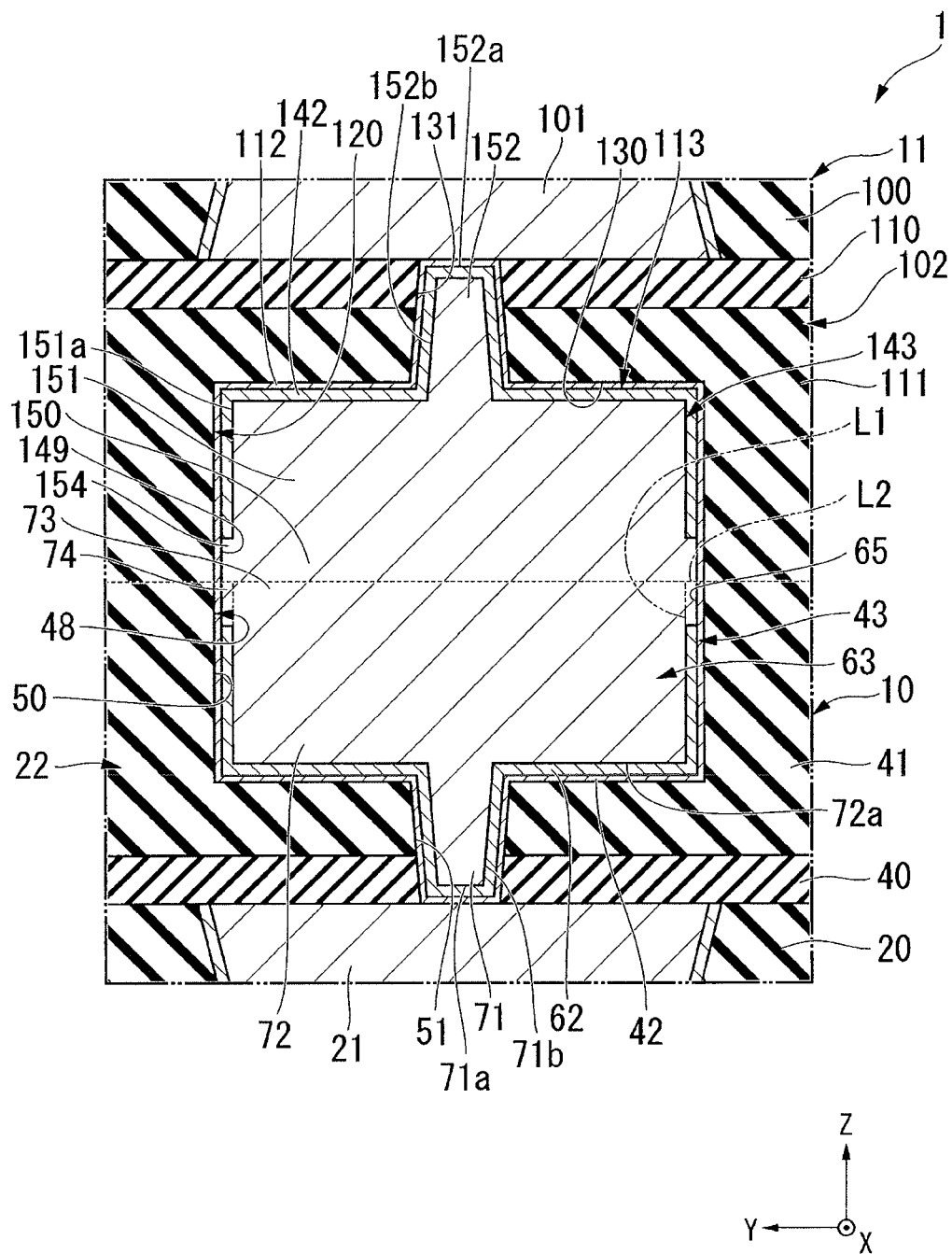
FIG. 15 is an enlarged cross-sectional view corresponding to FIG. 1 according to a modification of the embodiment.

In the embodiment described above, although the configuration in which the pad recess portions 50 and 130 are formed in a tapered shape is described, the present disclosure is not limited to this configuration. For example, as shown in FIG. 15, the outer shapes of the pad recess portions 50 and 130 in a plan view may be entirely uniform in the Z direction.

Figure 16:
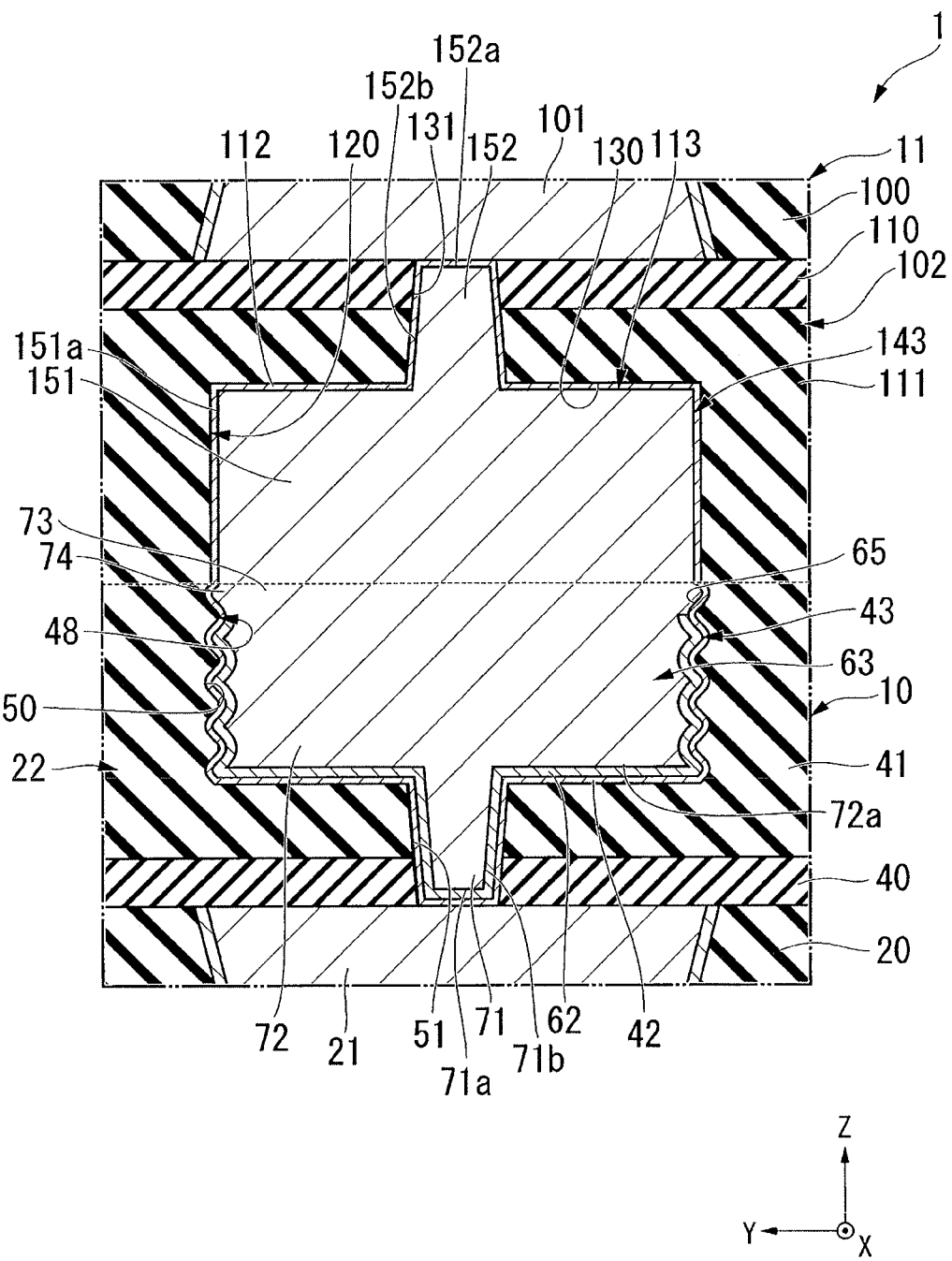
FIG. 16 is an enlarged cross-sectional view corresponding to FIG. 1 according to a modification of the embodiment.

In the embodiment described above, although the case where the inner surfaces of the recess portions 48 and 120 are smooth surfaces is described, the present disclosure is not limited to this configuration. For example, as shown in FIG. 16, the inner surfaces of the recess portions 48 and 120 may be uneven surfaces.

In the embodiment described above, although the configuration in which the first layer 62 is formed along the inner surface of the first recess portion 48 is described, the present disclosure is not limited to this configuration. The first layer 62 may be formed at an optional position in the first recess portion 48 as long as the first layer 62 is recessed from the upper surface of the first interlayer insulating layer 41. In this case, the first layer 62 may be configured to extend in a bar shape in the Z direction at a central portion in a plan view in the first recess portion 48.

Further, if the volumetric capacity S of the housing portion 65 and the volumes of the bulging portions 212 are set to be approximately the same, a dimension of the housing portion 65 may be changed as appropriate.

In the embodiment described above, although the configuration in which the recess portions 48 and 120 respectively penetrate the connection layers 22 and 102 in the Z direction is described, the present disclosure is not limited to this configuration. The recess portions 48 and 120 may be configured not to penetrate the connection layers 22 and 102 as long as at least the first pad portion 43 and the second pad portion 113 are bonded to each other.

According to at least one embodiment described above, the semiconductor device includes the first wiring layer, the first insulating layer, the first electrode, the second wafer, the second wiring layer, the second insulating layer, the second electrode, and the first layer. The first wiring layer is provided in the first wafer. The first insulating layer is provided at one side of a first direction with respect to the first wiring layer. The first electrode is provided in the first insulating layer and includes a first surface connected to the first wiring layer, a second surface located away from the first surface in one direction of the first direction, a third surface located farther away from the first surface than the second surface in one direction of the first direction, a first side surface directed from the first surface to the second surface, and a fourth surface directed from the second surface to the third surface. The second wiring layer is provided in the second wafer. The second insulating layer is provided in the other direction of the first direction with respect to the second wiring layer. The second electrode is provided in the second insulating layer and includes a fifth surface connected to the second wiring layer, a sixth surface located away from the fifth surface in the other direction of the first direction, a seventh surface located farther away from the fifth surface than the sixth surface in the other direction of the first direction and connected to the third surface, a second side surface directed from the fifth surface to the sixth surface, and an eighth surface directed from the sixth surface to the seventh surface. The first layer is provided between the fourth surface and a portion of the first insulating layer that surrounds the fourth surface, and is provided away from the third surface in the first direction.

With such a configuration, the bonding strength among the substrates is enhanced, and then the excellent conductivity is obtained.

Hereinafter, several semiconductor devices will be supplementarily described.

[1]. A semiconductor device including:
a first insulating layer formed with a first recess portion recessed in a first direction;
a first pad portion provided in the first recess portion and including a first conductor;
a second insulating layer formed with a second recess portion that faces the first recess portion in the first direction, and stacked in the first direction with respect to the first insulating layer; and
a second pad portion including a main portion that extends in the first direction in the second recess portion, a second conductor that includes a projection portion that projects toward a second direction intersecting the first direction from an end portion of the main portion near the first pad portion, and an interposition layer provided on an opposite side of the first pad portion with respect to the projection portion in the first direction.

[2]. The semiconductor device according to [1], in which
the interposition layer is provided along an inner surface of the second recess portion, and
an end edge of the interposition layer near the first pad portion in the first direction is provided on a side opposite to the first pad portion in the first direction with respect to an opening end of the second recess portion.

[3]. The semiconductor device according to [2], in which
a film thickness of the interposition layer in a normal direction of the inner surface of the second recess portion is smaller than a distance in the first direction from an end edge of the second recess portion near the first pad portion to the end edge of the interposition layer near the first pad portion.

[3]. The semiconductor device according to [2], in which
the second pad portion includes a metal layer between the inner surface of the second recess portion and the interposition layer.

[4]. The semiconductor device according to [2], in which
the second pad portion includes a conductive portion including the second conductor and the interposition layer, and
a metal layer provided between the conductive portion and the inner surface of the second recess portion.

[5]. The semiconductor device according to [4], in which
the metal layer extends to a position closer to the first pad portion than the interposition layer.

[6]. The semiconductor device according to [4], in which
the metal layer contains tantalum or tantalum nitride.

[7]. The semiconductor device according to [1], in which
the second conductor is formed over an entire opening surface of the second recess portion.

[8]. The semiconductor device according to [1], in which
the second conductor contains copper.

[9]. The semiconductor device according to [1], in which
the interposition layer has conductivity and is formed of a material having an etching rate higher than that of the second conductor.

[10]. The semiconductor device according to [1], in which
the interposition layer contains titanium.

[11]. The semiconductor device according to [1], in which
the first conductor includes a main portion that extends in the first direction in the first recess portion and a projection portion that projects in the second direction from an end portion of the main portion near the second pad portion, and
the first pad portion includes an interposition layer provided on a side opposite to the second pad portion with respect to the projection portion of the first conductor in the first direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first wafer;
a first wiring layer provided in the first wafer;
a first insulating layer provided at a side of the first wiring layer along a first direction;
a first electrode, provided in the first insulating layer, that includes a first surface connected to the first wiring layer, a second surface spaced from the first surface along the first direction, a third surface spaced further from the first surface than the second surface along the first direction, a first side surface extended from the first surface to the second surface, and a fourth surface extended from the second surface to the third surface;
a second wafer;
a second wiring layer provided in the second wafer;
a second insulating layer provided at a side of the second wiring layer along the first direction that faces the side of the first wiring layer;
a second electrode, provided in the second insulating layer, that includes a fifth surface connected to the second wiring layer, a sixth surface spaced from the fifth surface along the first direction, a seventh surface spaced further from the fifth surface than the sixth surface along the first direction, the seventh surface being connected to the third surface, a second side surface extended from the fifth surface to the sixth surface, and an eighth surface extended from the sixth surface to the seventh surface; and
a first layer provided between the fourth surface and a portion of the first insulating layer that surrounds the fourth surface, and provided spaced from the third surface in the first direction.

2. The semiconductor device according to claim 1, further comprising: a second layer provided between the eighth surface and a portion of the second insulating layer that surrounds the eighth surface, and provided spaced from the seventh surface.

3. The semiconductor device according to claim 1, wherein the third surface is longer than the second surface in a second direction that intersects the first direction.

4. The semiconductor device according to claim 1, wherein
the first layer further extends between the second surface and a portion of the first insulating layer located between the second surface and the first wiring layer, between the first side surface and a portion of the first insulating layer that surrounds the first side surface, and between the first surface and the first wiring layer, and
the first surface is connected to the first wiring layer via the first layer.

5. The semiconductor device according to claim 1, wherein the first electrode is formed of a conductor, and the first layer is provided above the fourth surface of the first electrode.

6. The semiconductor device according to claim 1, wherein a portion of the first electrode is provided between the first layer and the third surface.

7. The semiconductor device according to claim 2, wherein the first layer and the second layer each includes titanium.

8. The semiconductor device according to claim 1, wherein the each of first electrode and the second electrode includes copper.

9. The semiconductor device according to claim 1, wherein a third layer is provided between the first layer and the first insulating layer that surrounds the fourth surface.

10. A semiconductor device comprising:
a first wafer;
a first wiring layer provided in the first wafer;
a first insulating layer provided over the first wiring layer; and
an electrode, wherein the electrode includes:
 a first portion, provided in the first insulating layer, that is connected to the first wiring layer and has a first length in a first direction parallel to a surface of the first wafer;
 a second portion, provided in the first insulating layer and integral with the first portion, having a second length greater than the first length in the first direction and a third length greater than the second length in the first direction; and
 a third portion, provided on the first insulating layer and in a second insulating layer below the second wafer where the second wiring layer is provided, that is connected to the second portion and has a fourth length less than the third length in the first direction.

11. The semiconductor device according to claim 10, wherein the electrode further includes a fourth portion, provided in the second insulating layer, that is connected to the second wiring layer, integrally formed with the third portion, and has a fifth length less than the fourth length in the first direction.

12. The semiconductor device according to claim 10, wherein
a first layer is provided between the first insulating layer and the second portion of the electrode, and a second layer is further provided between the second insulating layer and the third portion of the electrode, and
in a cross section along which the first wiring layer, the first insulating layer, the second insulating layer, the second wiring layer, the first portion, the second portion, and the third portion are cut, the second length is a length at two boundary lines between the first insulating layer and the second portion, and the fourth length is a length at two boundary lines between the second insulating layer and the third portion.

13. The semiconductor device according to claim 12, wherein each of the first layer and the second layer includes titanium.

14. The semiconductor device according to claim 10, wherein the electrode includes copper.

15. A semiconductor device comprising:
a first wafer including first signal line;
an insulating layer provided above the first signal line;
a second wafer provided above the insulating layer and including a second signal line;
a first electrode portion provided above the first signal line, surrounded by the insulating layer, and electrically connected to the first signal line;
a second electrode portion provided above the first electrode portion, surrounded by the insulating layer, connected to the first electrode portion, and having a cross-sectional area greater than a cross-sectional area of the first electrode portion in an intersecting direction that intersects a direction along which the first wafer and the second wafer are stacked;
a first conductive layer provided between the second electrode portion and a portion of the insulating layer that surrounds the second electrode portion;
a third electrode portion provided above the second electrode portion and the first conductive layer, surrounded by the insulating layer, connected to the second electrode portion, and having a cross-sectional area greater than the cross-sectional area of the second electrode portion in the intersecting direction;
a fourth electrode portion provided above the third electrode portion, surrounded by the insulating layer, connected to the third electrode portion, and having a cross-sectional area greater than the cross-sectional area of the second electrode portion in the intersecting direction;
a fifth electrode portion provided above the fourth electrode portion, surrounded by the insulating layer, connected to the fourth electrode portion, and having a cross-sectional area less than the cross-sectional area of the fourth electrode portion in the intersecting direction;
a second conductive layer provided between the fifth electrode portion and a portion of the insulating layer that surrounds the fifth electrode portion, and provided on the fourth electrode portion; and
a sixth electrode portion provided on the fifth electrode portion, surrounded by the insulating layer, connected to the fifth electrode portion, electrically connected to the second signal line, and having a cross-sectional area less than the cross-sectional area of the fifth electrode portion in the intersecting direction.

16. The semiconductor device according to claim 15, wherein the cross-sectional area of the second electrode portion increases as a distance between the second electrode and the first electrode portion increases.

17. The semiconductor device according to claim 15, wherein the third electrode portion includes a first region connected to the fourth electrode portion, and a second region facing the insulating layer.

18. The semiconductor device according to claim 15, wherein the cross-sectional area of the second electrode portion along the intersecting direction is three times or more than a maximum cross-sectional area of the first electrode portion.

19. The semiconductor device according to claim 15, further comprising:
- a third conductive layer provided between the second electrode portion and a portion located below the insulating layer, and connected to the first conductive layer; and
- a fourth conductive layer provided between the first electrode portion and a portion of the insulating layer that surrounds the first electrode portion, and connected to the third conductive layer and the first signal line.

20. The semiconductor device according to claim 15, wherein each of the first conductive layer and the second conductive layer includes titanium.

21. The semiconductor device according to claim 15, wherein each of the first electrode portion, the second electrode portion, the third electrode portion, the fourth electrode portion, the fifth electrode portion, and the sixth electrode portion includes copper.

* * * * *